(12) United States Patent
Nadeau et al.

(10) Patent No.: US 9,341,792 B2
(45) Date of Patent: May 17, 2016

(54) VENT STRUCTURES FOR ENCAPSULATED COMPONENTS ON AN SOI-BASED PHOTONICS PLATFORM

(75) Inventors: Mary Nadeau, Alburtis, PA (US); John Fangman, Leesport, PA (US); Duane Stackhouse, Coopersburg, PA (US); Craig Young, Nazareth, PA (US); David Piede, Allentown, PA (US); Vipulkumar Patel, Breinigsville, PA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 24 days.

(21) Appl. No.: 13/154,699

(22) Filed: Jun. 7, 2011

(65) Prior Publication Data

US 2011/0317958 A1    Dec. 29, 2011

Related U.S. Application Data

(60) Provisional application No. 61/359,489, filed on Jun. 29, 2010.

(51) Int. Cl.
| | | |
|---|---|---|
| G02B 6/12 | (2006.01) | |
| G02B 6/42 | (2006.01) | |
| H01S 5/022 | (2006.01) | |
| H01S 5/0683 | (2006.01) | |

(52) U.S. Cl.
CPC ............ *G02B 6/4256* (2013.01); *H01S 5/0222* (2013.01); *H01S 5/02248* (2013.01); *H01S 5/02288* (2013.01); *H01S 5/0683* (2013.01)

(58) Field of Classification Search
None
See application file for complete search history.

(56) References Cited

U.S. PATENT DOCUMENTS

| | | | |
|---|---|---|---|
| 6,130,107 A | 10/2000 | Brady et al. | |
| 6,296,691 B1 * | 10/2001 | Gidumal | ............................ 96/17 |
| 6,323,550 B1 * | 11/2001 | Martin et al. | ................. 257/704 |
| 6,489,659 B2 | 12/2002 | Chakrabarti et al. | |
| 6,517,258 B1 | 2/2003 | Keska et al. | |
| 6,744,109 B2 | 6/2004 | Barton et al. | |
| 7,035,301 B2 | 4/2006 | Chikugawa | |
| 7,279,831 B2 | 10/2007 | McDonough et al. | |
| 7,306,659 B2 | 12/2007 | Gorton et al. | |
| 7,329,056 B2 | 2/2008 | Sherrer et al. | |
| 7,815,836 B2 | 10/2010 | Su | |
| 2004/0216745 A1 * | 11/2004 | Yuen | ...................... A62B 19/00 |
| | | | 128/205.27 |
| 2006/0086813 A1 * | 4/2006 | Beatty et al. | ................. 236/44 A |
| 2006/0171065 A1 * | 8/2006 | Akamatsu et al. | ......... 360/97.02 |

FOREIGN PATENT DOCUMENTS

| | | |
|---|---|---|
| JP | 05-034623 | 2/1993 |
| JP | 10-209414 | 8/1998 |

\* cited by examiner

*Primary Examiner* — Khaja Ahmad
(74) *Attorney, Agent, or Firm* — Patterson + Sheridan, LLP

(57) ABSTRACT

An silicon-on-insulator (SOI)-based photonics platform is formed to including a venting structure for encapsulating the active and passive optical components formed on the SOI-based photonics platform. The venting structure is used to allow for the encapsulated components to "breathe" such that water vapor and gasses will pass through the package and not condensate on any of the encapsulated optical surfaces. The venting structure is configured to also to prevent dust, liquids and other particulate material from entering the package.

20 Claims, 3 Drawing Sheets

VENT STRUCTURES FOR ENCAPSULATED COMPONENTS ON AN SOI-BASED PHOTONICS PLATFORM

CROSS-REFERENCE TO RELATED APPLICATIONS

This application claims the benefit of U.S. Provisional Application No. 61/359,489, filed Jun. 29, 2010 and herein incorporated by reference.

TECHNICAL FIELD

The present invention relates to silicon-on-insulator (SOI)-based photonic arrangements and, more particularly, to a vented packaging arrangement for encapsulating components on an SOI-based photonics platform.

BACKGROUND OF THE INVENTION

For many photonic products based on a silicon-on-insulator (SOI) opto-electronics platform, photonic components such as lasers, active optical devices and passive optical devices are mounted on (or integrated within) the same SOI substrate as the associated optical waveguides. In some cases, the electrical integrated circuits (ICs) used to control the lasers and other active optical devices are also mounted on/integrated within the common SOI substrate.

For any component with an optical "surface" (e.g., lasers, lenses, waveguide endface, etc.), dust and water condensation collecting on the optical surface will degrade the performance of the component, causing the optical signal entering or exiting the surface to scatter and reduce the power remaining along the optical signal path. Additionally, some active components (such as laser diodes and detectors) require a stringent operating environment for long-term reliability. Dust and water condensation are known to degrade the performance of these devices, leading to premature failure.

In order to protect a laser (or other critical component(s)) from dust/condensation, one prior art approach is to house these devices in a sealed environment (such as a hermetic package). As a general practice, hermetic sealing is relatively expensive and is not considered as a preferred alternative for use in high volume, consumer applications.

One non-hermetic prior art arrangement for protecting components from dust and water condensation utilizes a "cap" that is attached to and sealed around the perimeter of the SOI substrate. The cap is generally formed of a polymer material and is usually attached to the SOI substrate using adhesives or solders. FIG. 1 is a side view of an SOI photonics platform including this prior art type of cap. FIG. 1 shows an SOI photonics platform 1 including a silicon substrate layer 2, a buried oxide layer 3 and a relatively thin silicon surface layer 4 (hereinafter referred to as SOI layer 4). Optical waveguides are generally formed within SOI layer 4. In this particular configuration, a laser diode 5 is disposed within an etched region formed through SOI layer 4 and buried oxide layer 3 so as to be placed upon silicon substrate 2. An optical detector 6 is positioned behind laser diode 5 (used in this case as a backface monitor). A lensing arrangement 7 is positioned along the output signal path from laser diode 5 and is used to focus the propagating optical signal into an optical waveguide 8 formed within SOI layer 4. A set of electrical contacts 9 to both laser diode 5 and detector 6 are wire bonded to bond pads 10 placed above the interlayer dielectric (ILD) layer 11 of SOI photonic platform 1.

As shown in FIG. 1, a cap 20 is disposed to cover and encapsulate the optical and electrical components included within the SOI photonics platform 1. An adhesive/epoxy 22 is used to attach cap 20 to the platform. Cap 20 is generally formed of a polymer material and is suitable for preventing dust, liquids and other particulate matter from entering the structure and interfering with the operation of the optical components.

While the arrangement of FIG. 1 is considered an improvement in terms of protecting the sensitive optical devices to an extent, it is still possible for moisture to penetrate through the cap, allowing water to condense inside the enclosure. Thus, a need remains for an encapsulation arrangement of SOI-based photonic structures that does not require the use of a hermetic seal to prevent the build-up of condensation within the package.

SUMMARY OF THE INVENTION

The need remaining in the prior art is addressed by the present invention, which relates to silicon-on-insulator (SOI)-based photonic arrangements and, more particularly, to a vented packaging arrangement for encapsulating components on an SOI-based photonics platform.

In accordance with the present invention, a venting structure is used in conjunction with an SOI-based photonics platform to allow for the encapsulated components to "breathe" such that water vapor and gasses will pass through the venting structure and not condensate on any of the encapsulated optical surfaces. The venting structure is also configured to prevent dust, liquids and other particulate material from entering the package.

In one embodiment, a vented cap is formed and comprises a breathable membrane formed as part of a conventional polymer cap. Alternatively, a plurality of slots (microstructure dimensioned) are formed through a cap comprising silicon (or another material that can be processed to form microstructured openings). The slots are sized to allow for exchange of water vapor and gasses without permitting dust, liquids and particulate matter from entering the enclosure.

In yet another embodiment, a plurality of etched through-holes are formed in the SOI structure itself, creating a path from "inside" the package to the outside, creating vents within the structure itself to prevent condensation within the package; a conventional cap may then be utilized to prevent dust, liquids and particulate matter from entering the package. Alternatively, a vented cap may be used in conjunction with the plurality of etched through-holes to provide additional paths for the exchange of water vapor and gasses between the interior and exterior of the package.

Other and further embodiments of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 2:
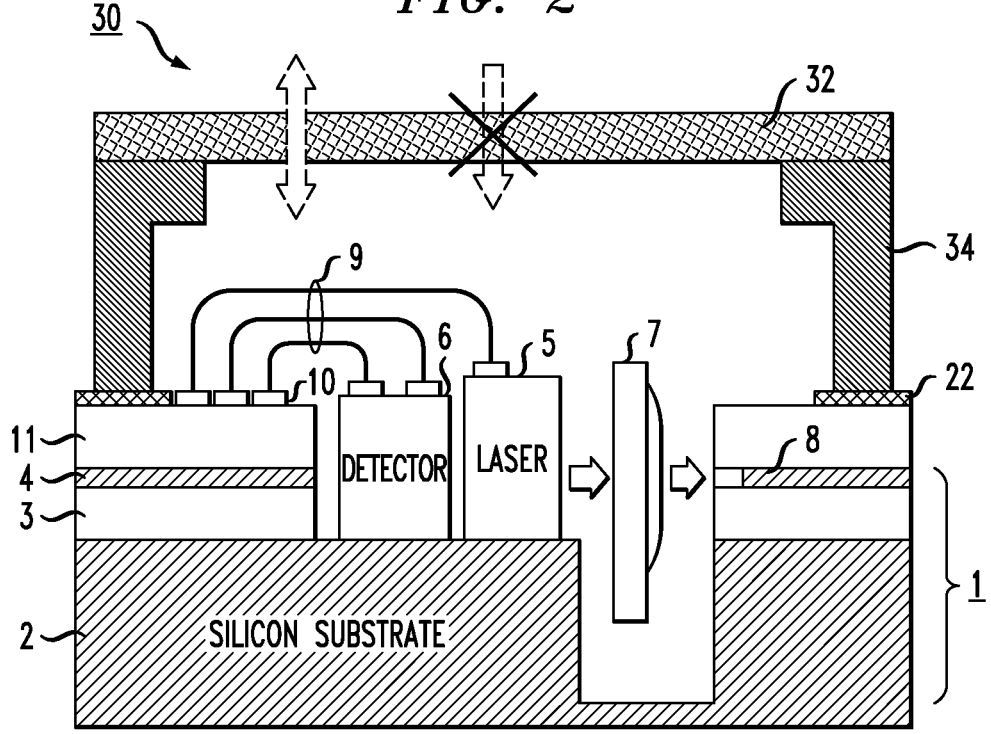
FIG. 2 illustrates an exemplary vented SOI-based photonics platform formed in accordance with the present invention, in this case including a breathable membrane incorporated with the cap.

FIG. 2 illustrates an exemplary vented SOI-based photonics platform formed in accordance with the present invention. The exemplary optical and electrical components as described above are also shown in FIG. 2 (and the following drawings), where the specific included components and their arrangement are not considered as relevant to the present invention and are shown merely for the sake of illustrating the application of the invention.

It is proposed to include a vent structure with the encapsulated optical components to allow for any moisture that may be present to escape during "turn-on" and operation of the photonic arrangement. At the same time, the vent structure prevents dust particles, liquids and other particulate matter from entering the enclosure at all times. Advantageously, the vent structure allows for equalization of pressure during changing environmental conditions.

In the embodiment shown in FIG. 2, the inventive venting arrangement takes the form of a vented cap structure 30 disposed over and attached to SOI-based photonics platform 1. Vented cap structure 30 is shown as including a breathable membrane 32 formed of a polymer-based membrane material (one example being sold under the tradename GORE™ Protective Vents). Breathable membrane 32 allows for water vapor and gasses to pass through, in both directions, in an unimpeded fashion, as shown by the double-ended arrow in FIG. 2. At the same time, breathable membrane 32 prevents dust, liquids and other particulate matter from entering the package (depicted by the "X"-d out arrow in FIG. 2).

Figure 1:
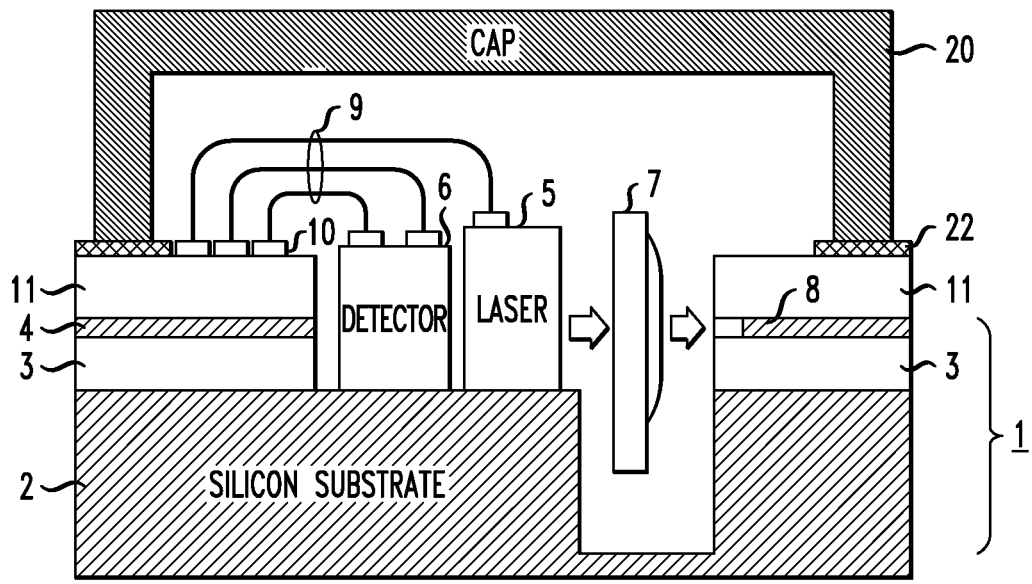
FIG. 1 shows a prior art encapsulation arrangement for an SOI-based photonics platform, using a cap to prevent dust from contaminating optical surfaces.

In the particular embodiment shown in FIG. 2, breathable membrane 32 is used as the upper surface of cap structure 30 and is sealed to sidewall 34 of cap structure 30, sidewall 34 comprising a conventional material used for a cap or housing, such as a polymer. Sidewall 34 is then attached to the top surface of SOI photonics platform 1 using adhesive/epoxy 22 in the manner of the prior art as shown in FIG. 1. The amount of actual surface area covered by breathable membrane 32 is considered to be a design choice. While shown as completely covering the top surface of cap structure 30 in the embodiment of FIG. 2, it is also possible for breathable membrane 32 to form only a portion of the top surface or, alternatively, a portion (or all) of the side surface, of vented cap structure 30.

Figure 3:
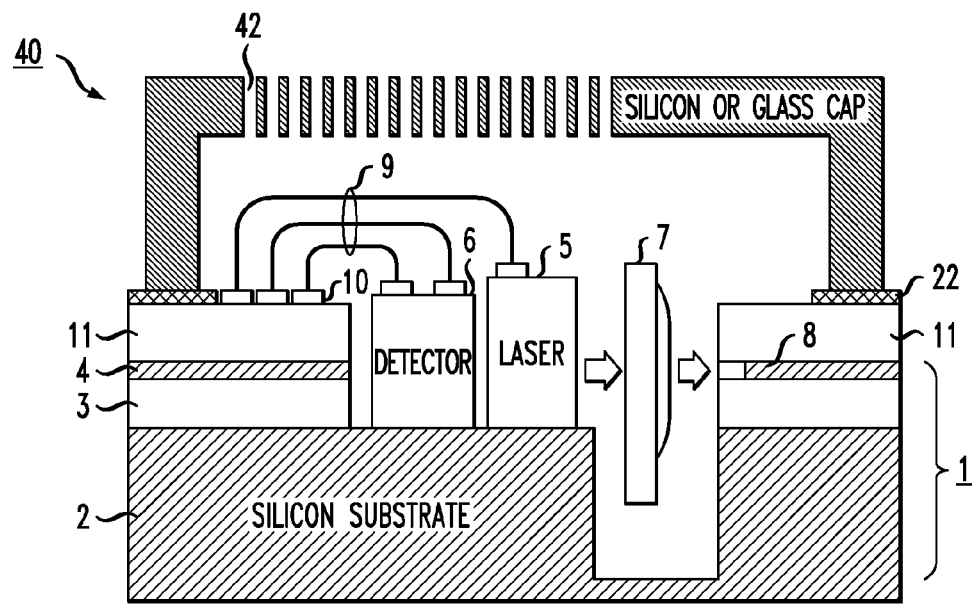
FIG. 3 illustrates an alternative vented cap for use in accordance with the present invention.

FIG. 3 illustrates another vented arrangement formed in accordance with the present invention. As with the embodiment of FIG. 2, the arrangement of FIG. 3 comprises a vented cap structure. Referring to FIG. 3, a vented cap structure 40 is shown, where cap structure 40 is formed of silicon or a glass material. In this embodiment, vented cap structure 40 is formed to include a plurality of etched through-holes 42. The size of the openings of through-holes 42 is exaggerated for the sake of illustration, where in implementation the holes comprise a diameter ranging from submicron to a few microns in size.

By using silicon (or any other suitable glass material), conventional IC processing can be used to form through-holes 42, including the location, number and arrangement of the holes. As with breathable membrane 32, through-holes 42 are sized to allow for vapor and gasses to pass in both directions through vented cap structure 40, while preventing dust particles, liquids and other particulate matter from entering the encapsulated arrangement. Vented cap structure 40 is attached to the top surface of SOI photonics platform 1 using, for example, a wafer scale bonding process or other suitable adhesive/epoxy 22.

Figure 4:
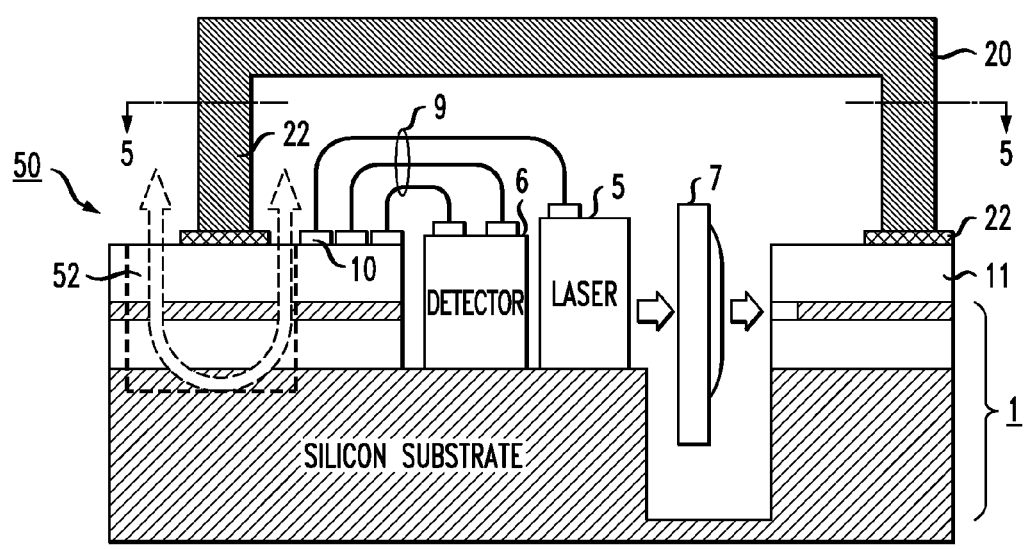
FIG. 4 shows yet another embodiment of the present invention, including a vent structure formed within the SOI structure itself to prevent condensation, this embodiment also using a conventional cap to prevent dust contamination.
Figure 5:
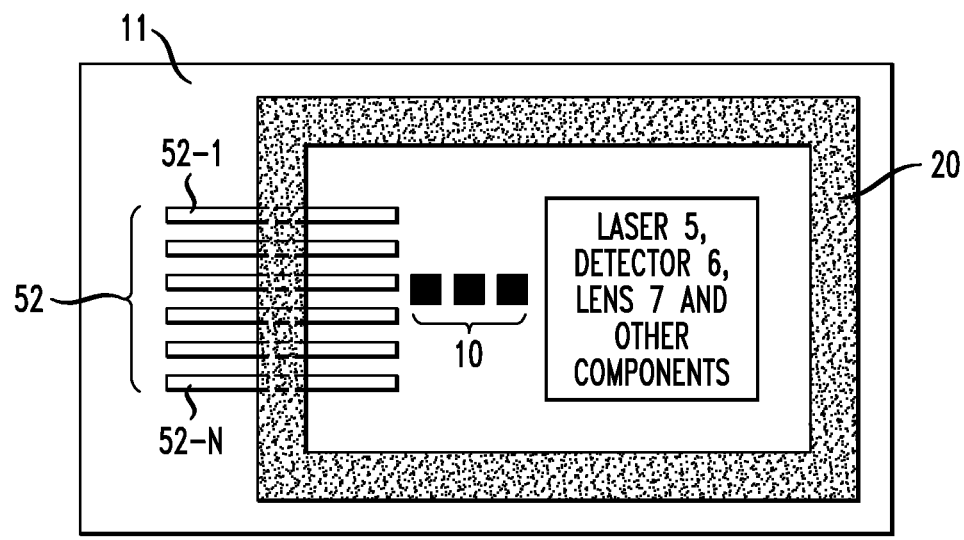
FIG. 5 is a cut-away top view of an embodiment utilizing a vent structure formed within the SOI structure, as with FIG. 4, in this top view showing three separate pluralities of vias used to vent the enclosed arrangement.

As mentioned above, it is possible to provide venting in the SOI-based opto-electronics platform without the need to modify the cap structure as used in prior art encapsulation methods. FIG. 4 illustrates an embodiment of the present invention including a venting arrangement 50 that is formed within and through the layers of SOI photonics platform 1. A top view of this arrangement is shown in FIG. 5. A conventional cap 20 as associated with the prior art can be used with this embodiment to prevent dust, liquids and other particulate matter from entering encapsulated arrangement.

Referring to FIG. 4, venting arrangement 50 includes at least one slot (microtrench) 52 formed through a portion of ILD layer 11 of SOI photonics platform 1. As shown, slot 52 is formed to extend from an area outside of the encapsulated arrangement to an interior region thereof (slot 52 being shown in phantom in the view of FIG. 4). Slot 52 is formed to have a width ranging from submicron to a few microns, and exhibit a length at least sufficient to extend underneath the sidewall 20-S of cap 20. Slot 52 may be formed through one or more of the underlying layers including SOI layer 4, buried oxide layer 3 and silicon substrate 2 (at least needing to be formed through a depth of ILD layer 11). The particular embodiment as shown in FIG. 4 illustrates slot 52 as extending into the upper portion of the silicon substrate.

Preferably, the vented structure embodiment of the present invention as shown in FIG. 4 utilizes a plurality of slots 52. FIG. 5 is a cut-away top view, taken along line 5-5 of FIG. 4, illustrating an exemplary arrangement using a plurality of slots 52-1 through 52-N disposed in parallel. While the slots are shown in this particular location, it is to be understood that the slots may be formed at any suitable location (or locations) around the periphery of the encapsulated arrangement.

Figure 6:
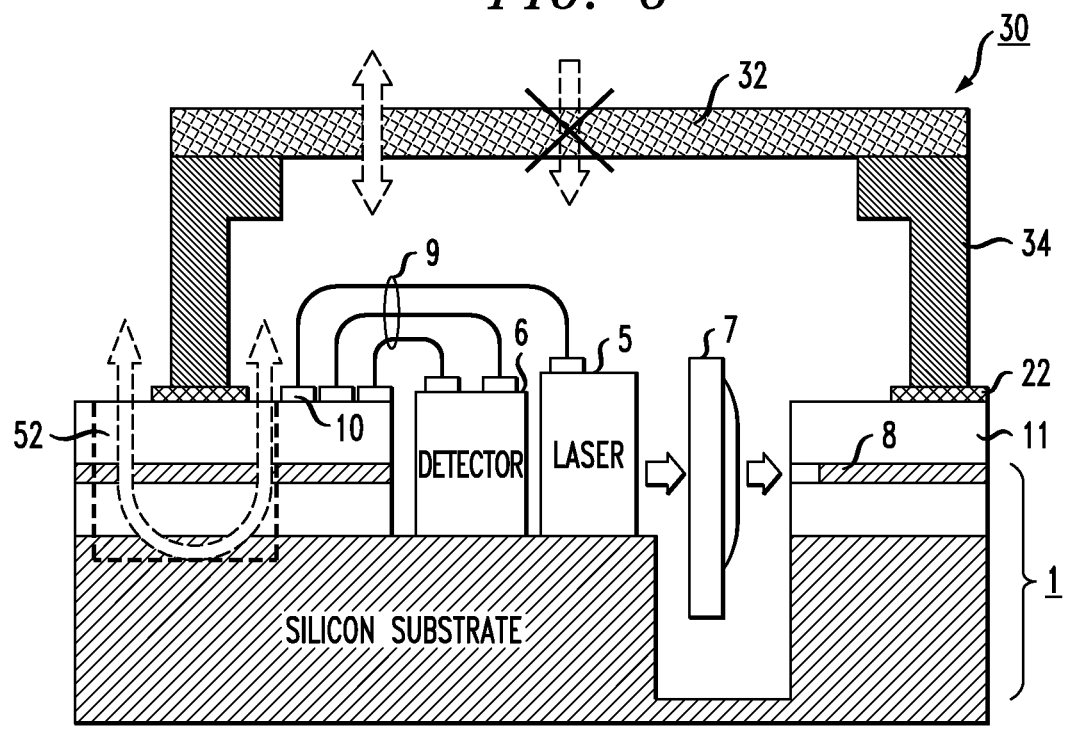
FIG. 6 shows yet another embodiment of the present invention, utilizing the vented substrate as shown in FIG. 4 in conjunction with the breathable membrane as shown in FIG. 2.

It is also possible to use the venting arrangement as shown in FIG. 4 in conjunction with the vented cap arrangement as shown in FIG. 2 or 3, providing pathways for exchange of water vapor and gasses through both locations (SOI substrate and cap) in the enclosed arrangement. FIG. 6 illustrates one exemplary embodiment using breathable membrane 32 in conjunction with venting slot 52.

It is to be understood that the above-described arrangements are merely illustrative of the many possible specific embodiments that can be devised to represent application of the principles of the invention. Numerous and varied other arrangements can be conceived in accordance with these principles by those skilled in the art without departing from the spirit and scope of the present invention as defined by the claims appended hereto.

What is claimed is:
1. A system within an environment, the system comprising:
   a silicon-on-insulator (SOI)-based photonics platform including a plurality of optical components configured to communicate optical signals therebetween;
   a cap member which, when attached with a planar surface of the photonics platform, forms an enclosed volume within which the plurality of optical components are disposed, the cap member configured to prevent dust, liquids, and particulate matter from entering the volume from the environment; and a passive venting arrangement providing selective fluid communication between the enclosed volume and the environment, the selective fluid communication including a bidirectional exchange of water vapor and other gases while excluding dust, liquids, and particulate matter, the planar surface defining a plurality of openings, a first opening in fluid communication with the environment and a second opening in fluid communication with the enclosed volume, and at least a first slot formed within the photonics platform to a predetermined depth from the planar surface, the first slot extending from the first opening to the second opening, wherein the passive venting arrangement comprises the first slot.

2. The system of claim 1, wherein the cap member is a vented cap structure having at least a portion of the passive venting arrangement formed therein.

3. The system of claim 1, wherein the photonics platform further comprises a second slot formed within the photonics platform and extending between third and fourth openings of the plurality of openings, the third opening in fluid communication with the environment and the fourth opening in fluid communication with the volume, wherein the passive venting arrangement further comprises the second slot.

4. The system of claim 3, wherein the first and second slots are disposed in parallel with each other.

5. The system of claim 1, wherein the first slot extends through an interlayer dielectric (ILD) layer of the photonics platform.

6. The system of claim 5, wherein the first slot further extends through one or more of an SOI layer, a buried oxide (BOX) layer, and a silicon substrate of the photonics platform.

7. The system of claim 1, wherein the cap member is a non-vented cap structure.

8. A system within an environment, the system comprising:
a silicon-on-insulator (SOI)-based photonics platform including a plurality of optical components configured to communicate optical signals therebetween; and
a vented cap member which, when attached with the photonics platform, forms an enclosed volume within which the plurality of optical components are disposed, the cap member providing selective fluid communication between the enclosed volume and the environment, the selective fluid communication including bidirectional exchange of water vapor and other gases while excluding dust, liquids, and particulate matter,
wherein the photonics platform comprises a planar surface defining a plurality of openings, a first opening in fluid communication with the environment and a second opening in fluid communication with the enclosed volume, and
wherein at least a first slot is formed within the photonics platform to a predetermined depth from the planar surface, the first slot extending from the first opening to the second opening.

9. The system of claim 8, wherein at least a portion of the vented cap member comprises a breathable membrane.

10. The system of claim 8, wherein at least a portion of the vented cap member is formed of one of a silicon and a glass material, and wherein a plurality of through-holes are formed through the portion of the vented cap member.

11. The system of claim 10, wherein the plurality of through-holes have a diameter on the order of one micron or less.

12. The system of claim 1, wherein the plurality of optical components include at least one active optical component and at least one passive optical component.

13. The system of claim 12, wherein the at least one passive optical component includes an optical waveguide formed within an Sal layer of the photonics platform.

14. The system of claim 2, wherein the passive venting arrangement further comprises a breathable membrane formed as at least a portion of the cap member.

15. The system of claim 2, wherein at least a portion of the cap member is formed of one of a silicon and a glass material, and wherein the passive venting arrangement further comprises a plurality of through-holes formed through the portion of the cap member.

16. The system of claim 8, wherein the photonics platform further comprises a second slot formed within the photonics platform and extending between third and fourth openings of the plurality of openings, the third opening in fluid communication with the environment and the fourth opening in fluid communication with the enclosed volume.

17. The system of claim 16, wherein the first and second slots are disposed in parallel with each other.

18. The system of claim 8, wherein the first slot extends through an interlayer dielectric (ILD) layer of the photonics platform.

19. The system of claim 18, wherein the first slot further extends through one or more of an SOI layer, a buried oxide (BOX) layer, and a silicon substrate of the photonics platform.

20. A system within an environment, the system comprising:
a silicon-on-insulator (SOI)-based photonics platform including a plurality of optical components configured to communicate optical signals therebetween;
a cap member which, when attached with the photonics platform, forms an enclosed volume within which the plurality of optical components are disposed; and
a venting arrangement providing selective fluid communication between the enclosed volume and the environment, the selective fluid communication including a bidirectional exchange of water vapor and other gases while excluding dust, liquids, and particulate matter, a first portion of the venting arrangement formed within the cap member and a second portion of the venting arrangement formed within the photonics platform,
the second portion of the venting arrangement comprising a first opening in fluid communication with the environment, a second opening in fluid communication with the enclosed volume, and a first slot extending from the first opening to the second opening and formed to a predetermined depth from a planar surface of the photonics platform.

* * * * *